United States Patent
Zhu

(10) Patent No.: US 9,282,673 B2
(45) Date of Patent: Mar. 8, 2016

(54) CASING AND SERVER HAVING THE CASING

(71) Applicant: WISTRON CORPORATION, New Taipei (TW)

(72) Inventor: Chong-Xing Zhu, New Taipei (TW)

(73) Assignee: Wistron Corporation, New Taipei (TW)

( * ) Notice: Subject to any disclaimer, the term of this patent is extended or adjusted under 35 U.S.C. 154(b) by 171 days.

(21) Appl. No.: 14/288,420

(22) Filed: May 28, 2014

(65) Prior Publication Data

US 2015/0189785 A1   Jul. 2, 2015

(30) Foreign Application Priority Data

Dec. 30, 2013   (CN) ...................... 2013 2 0884817 U

(51) Int. Cl.
*H05K 7/14*   (2006.01)

(52) U.S. Cl.
CPC ............ *H05K 7/1487* (2013.01); *H05K 7/1477* (2013.01)

(58) Field of Classification Search
CPC ...... H05K 7/14; H05K 7/1487; H05K 7/1477
USPC ......... 361/679.37, 679.33; 360/86; 312/223.2
See application file for complete search history.

(56) References Cited

U.S. PATENT DOCUMENTS

| | | | | |
|---|---|---|---|---|
| 4,717,982 A | * | 1/1988 | Toreson | G11B 33/02 360/137 |
| 5,325,263 A | * | 6/1994 | Singer | G06F 1/184 361/679.39 |
| 6,834,766 B2 | * | 12/2004 | Lin | G06F 1/184 211/41.17 |

* cited by examiner

*Primary Examiner* — Dion R Ferguson
*Assistant Examiner* — Mandeep S Buttar
(74) *Attorney, Agent, or Firm* — The Mueller Law Office, P.C.

(57) ABSTRACT

A casing for fixing a plate member includes a casing body having opposite first and second side plates, and a clamping member having a resilient plate disposed on an inner side of the second side plate, at least one abutment arm protruding inwardly from the resilient plate and adapted to abut against a first surface of the plate member, and an engaging piece proximate to the abutment arm and adapted to releasably engage a second surface of the plate member. The first side plate and the resilient plate are respectively adapted to abut against first and second ends of the plate member for clamping therebetween the plate member. The resilient plate is pullable to move the engaging piece away from the second surface of the plate member.

20 Claims, 12 Drawing Sheets

CASING AND SERVER HAVING THE CASING

CROSS-REFERENCE TO RELATED APPLICATION

This application claims priority of Chinese Patent Application No. 201320884817.0, filed on Dec. 30, 2013, the disclosure of which is incorporated herein by reference.

BACKGROUND OF THE INVENTION

1. Field of the Invention

The invention relates to a casing, and more particularly to a casing for fixing a plate member and a server having the casing.

2. Description of the Related Art

An existing server generally includes a casing, a back plate disposed on the casing, and a plurality of hard disks. Each hard disk is disposed in the casing and is electrically connected to a corresponding transmission interface of the back plate. The casing is formed with a plurality of screw holes. The back plate is formed with a plurality of through holes corresponding in position to the screw holes. The back plate is fixed to the casing by extending a plurality of screws through the respective through holes and respectively engaging the screw holes using an auxiliary tool.

Since the back plate must be formed with the through holes for extension of the screws therethrough, the transmission interfaces for transmission of signals or power must be disposed on the back plate at positions evading that of the through holes. This leads to the transmission interfaces being densely disposed on the back plate. Furthermore, it is necessary to use the auxiliary tool to assemble or disassemble the back plate to or from the casing, so that assembly or disassembly of the back plate to or from the casing is very inconvenient and is time-consuming.

SUMMARY OF THE INVENTION

Therefore, an object of the present invention is to provide a casing that can permit easy and quick assembly and disassembly of a plate member without using an auxiliary tool. Through this, assembly and disassembly of the plate member can be facilitated, and the working time can be reduced.

Another object of this invention is to provide a casing that can conduct static electricity of a plate member to the ground through abutment of an abutment arm of a clamping member against a metal pad of the plate member.

According to one aspect of this invention, a casing for fixing a plate member comprises a casing body and a clamping member. The plate member includes opposite first and second ends, and opposite first and second surfaces between the first and second ends. The casing body includes a first side plate and a second side plate opposite to the first side plate. The clamping member includes a resilient plate disposed on an inner side of the second side plate, at least one abutment arm protruding inwardly from the resilient plate, and an engaging piece projecting from the resilient plate in proximity to the abutment arm. The first side plate and the resilient plate are respectively adapted to abut against the first and second ends of the plate member for clamping therebetween the plate member. The abutment arm is adapted to abut against the first surface of the plate member. The engaging piece is adapted to releasably engage the second surface of the plate member. The resilient plate is pullable to move the engaging piece away from the second surface of the plate member.

The abutment arm is a biasing arm for biasing the first surface of the plate member toward the engaging piece.

The plate member includes a metal pad disposed on the first surface thereof. The clamping member and the casing body are made of metal. The abutment arm includes an abutment face for abutment with the metal pad.

The resilient plate includes a fixed portion, and a pull portion which is integrally connected as one piece with the fixed portion and which is spaced apart from the second side plate. The engaging piece projects from one side of the pull portion that is opposite to the second side plate. The pull portion is pullable to move the engaging piece away from the second surface of the plate member.

The engaging piece has a guide inclined surface that is distal from the abutment arm and that is adapted to abut against the second end of the plate member. The pull portion and the engaging piece are adapted to be urged by the plate member to move toward the second side plate when the second end of the plate member abuts against the guide inclined surface.

The plate member includes at least one metal pad disposed on the first surface thereof. The abutment arm includes a connecting section connected to the fixed portion, and a bent section connected to the connecting section and having a wave shape. The bent section of the abutment arm includes an abutment face that is curved for abutment with the metal pad. The clamping member and the casing body are made of metal.

The plate member includes two metal pads disposed on the first surface thereof. The resilient plate is elongated and has two opposite long sides extending from the fixed portion to the pull portion. The clamping member includes two abutment arms. The connecting sections of the abutment arms are respectively connected to the long sides. The abutment faces of the bent sections of the abutment arms are adapted to abut respectively against the metal pads.

The plate member further includes two protrusions projecting from the second end thereof. The second side plate includes a main plate portion, and a bent plate portion bent outwardly from the main plate portion. The fixed portion of the resilient plate is positioned on the main plate portion. The pull portion of the resilient plate is spaced apart from the bent plate portion and is movable relative to the fixed portion toward the bent plate portion. The bent plate portion is adapted to abut against the protrusions of the plate member.

The first side plate has an inner surface, and two spaced-apart positioning plate portions bent inwardly to protrude from the inner surface of the first side plate. The positioning plate portions are adapted to respectively abut against the first surface and the second surface of the plate member so as to clamp therebetween the first end of the plate member. The positioning plate portions and the inner surface of the first side plate cooperatively define an engaging groove for engagingly receiving the first end of the plate member.

The plate member further includes a top end and a bottom end. The casing body further includes a top plate and a bottom plate for respectively abutting against the top and bottom ends of the plate member so as to clamp therebetween the plate member. One of the top and bottom plates is provided with a stop piece for abutment with the first surface of the plate member.

Still another object of this invention is to provide a server having a casing that can permit easy and quick assembly and disassembly of a plate member without using an auxiliary tool. Through this, assembly and disassembly of the plate member can be facilitated, and the working time can be reduced.

Still yet another object of this invention is to provide a server having a casing that can conduct static electricity of a plate member to the ground through abutment of an abutment arm of a clamping member against a metal pad of the plate member.

According to another aspect of this invention, a server comprises a circuit module, a casing and a hard disk module. The circuit module includes a plate member and an electrical connector. The plate member is a circuit board and includes opposite first and second ends and opposite first and second surfaces between the first and second ends. The electrical connector is disposed on the first surface. The casing includes a casing body and a clamping member. The casing body includes a first side plate and a second side plate opposite to the first side plate. The clamping member includes a resilient plate disposed on an inner side of the second side plate, at least one abutment arm protruding inwardly from the resilient plate, and an engaging piece projecting from the resilient plate in proximity to the abutment arm. The first side plate and the resilient plate respectively abut against the first and second ends of the plate member for clamping therebetween the plate member. The abutment arm abuts against the first surface of the plate member. The engaging piece is releasably engaged to the second surface of the plate member. The resilient plate is pullable to move the engaging piece away from the second surface of the plate member. The hard disk module is disposed in the casing body and includes a mating connector electrically connected to the electrical connector of the circuit module.

The efficiency of the present invention resides in that, through the configurations of the casing body and the clamping member the plate member can be easily and quickly assembled to and disassembled from the casing body without using an auxiliary tool. Through this, convenience of assembly and disassembly of the plate member can be enhanced, and the working time can be reduced. Moreover, through the abutment of the abutment face of each abutment arm of the clamping member with the respective metal pad, the casing and the chassis can channel the static electricity of the plate member to the ground.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE PREFERRED EMBODIMENT

Figure 1:
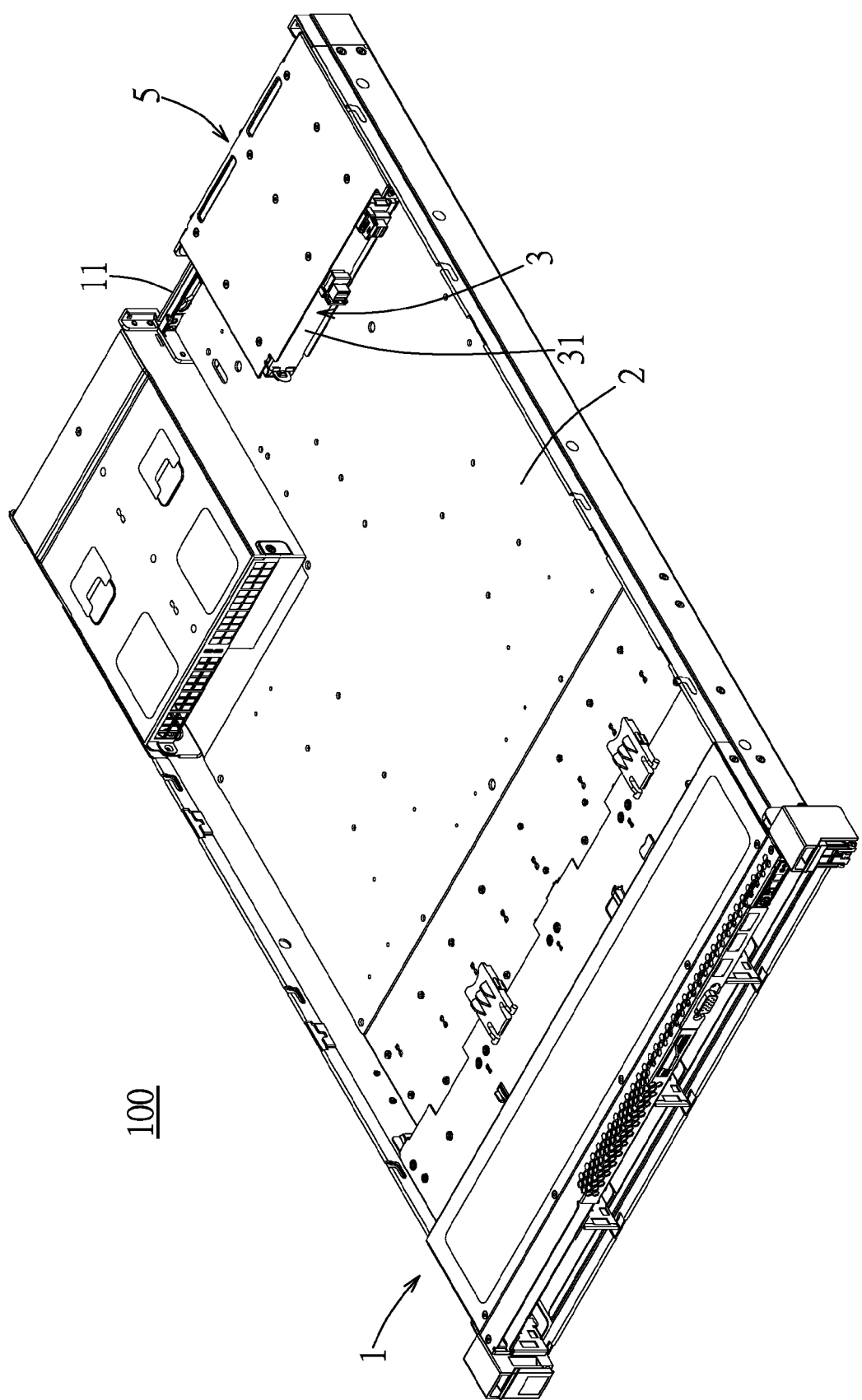
FIG. 1 is a perspective view of a server according to an embodiment of the present invention.

Referring to FIGS. 1 to 4, a server 100 according to an embodiment of the present invention comprises a chassis 1, a motherboard 2, a circuit module 3, a plurality of hard disk modules 4, and a casing 5.

The circuit module 3 includes a plate member 31, a plurality of first electrical connectors 32 and a plurality of second electrical connectors 33. In this embodiment, the plate member 31 is a circuit board, and includes a first end 311, a second end 312 opposite to the first end 311, and a first surface 313 and a second surface 314 between the first and second ends 311, 312. The first electrical connectors 32 are disposed spaced apart from each other on the first surface 313. The second electrical connectors 33 are disposed spaced apart from each other on the second surface 314. Each second electrical connector 33 is electrically connected to a respective first electrical connector 32 through the plate member 31, and is electrically connected to the motherboard 2 through a transmission line (not shown).

The casing 5 is disposed in the chassis 1. In this embodiment, the casing 5 is disposed adjacent to a rear end 11 of the chassis 1, but this is only used as an example of illustration and not as limitations of the invention. In an alternative embodiment, the casing 5 may be disposed adjacent to a front end of the chassis 1. The casing 5 is suitable for fixing the plate member 31 of the circuit module 3, and includes a casing body 50 and a clamping member 6. The casing body 50 and the clamping member 6 are both made of metal. The casing body 50 includes a lower casing member 51, a frame 52 disposed in the lower casing member 51, and an upper casing member 53 covering the lower casing member 51. The lower casing member 51, the frame 52 and the upper casing member 53 cooperatively define a plurality of receiving spaces 54.

The hard disk modules 4 are respectively disposed in the receiving spaces 54. Each hard disk module 4 includes a mating connector 41 inserted into a respective first electrical connector 32 to electrically connect with the same. Through this, each hard disk module 4 can be electrically connected to the motherboard 2 through the circuit module 3 and the transmission line for transmission of electrical signals.

The lower casing member 51 includes a bottom plate 510, a first side plate 511 connected to a lateral end of the bottom plate 510, and a second side plate 512 connected to the other lateral end of the bottom plate 510 and opposite to the first side plate 511. The upper casing member 53 includes a top plate 531 opposite to the bottom plate 510. The top plate 531 and the bottom plate 510 respectively abut against a top end 315 and a bottom end 316 of the plate member 31 so as to clamp therebetween the plate member 31, thereby preventing movement of the plate member 31 relative to the casing body 50 in a top-bottom direction (D1).

As shown in FIG. 3 and FIGS. 5 to 7, the first side plate 511 of the lower casing member 51 has an inner surface 513 for abutment with the first end 311 of the plate member 31. The clamping member 6 includes a resilient plate 61 disposed on an inner side of the second side plate 512, two abutment arms 62 protruding inwardly and transversely from the resilient plate 61 and spaced apart in the top-bottom direction (D1), and an engaging piece 63 projecting from the resilient plate 61 in proximity to the abutment arms 62. The first side plate 511 and the resilient plate 61 respectively abut against the first end 311 and the second end 312 of the plate member 31 so as to clamp therebetween the plate member 31, thereby preventing movement of the plate member 31 relative to the casing body 50 in a left-right direction (D2). At this time, the abutment arms 62 abut against the first surface 313 of the plate member 31, and the engaging piece 63 is releasably engaged with the second surface 314 of the plate member 31. Through this, movement of the plate member 31 relative to the casing body 50 in a front-rear direction (D3) can be prevented. Through the structural design of the casing body 50 and the clamping member 6, movement of the plate member 31 in the top-bottom direction (D1), the left-right direction (D2) and the front-rear direction (D3) can be prevented, so that the plate member 31 can be stably fixed in the casing 5.

Furthermore, the resilient plate 61 of the clamping member 6 is pullable in the direction of an arrow (P) (see FIG. 14) to move the engaging piece 63 away from the second surface 314 of the plate member 31 so as to permit removal of the plate member 31 from the casing body 50. That is, the plate member 31 can be easily and quickly removed from or assembled to the casing 5 without the use of an auxiliary tool. Hence, assembly and disassembly of the plate member 31 to and from the casing 5 can be easily performed and working hours can be greatly reduced.

Below is a detailed description of the concrete structure of the casing 5 and the method of assembling and disassembling the plate member 31 to and from the casing 5.

Figure 3:
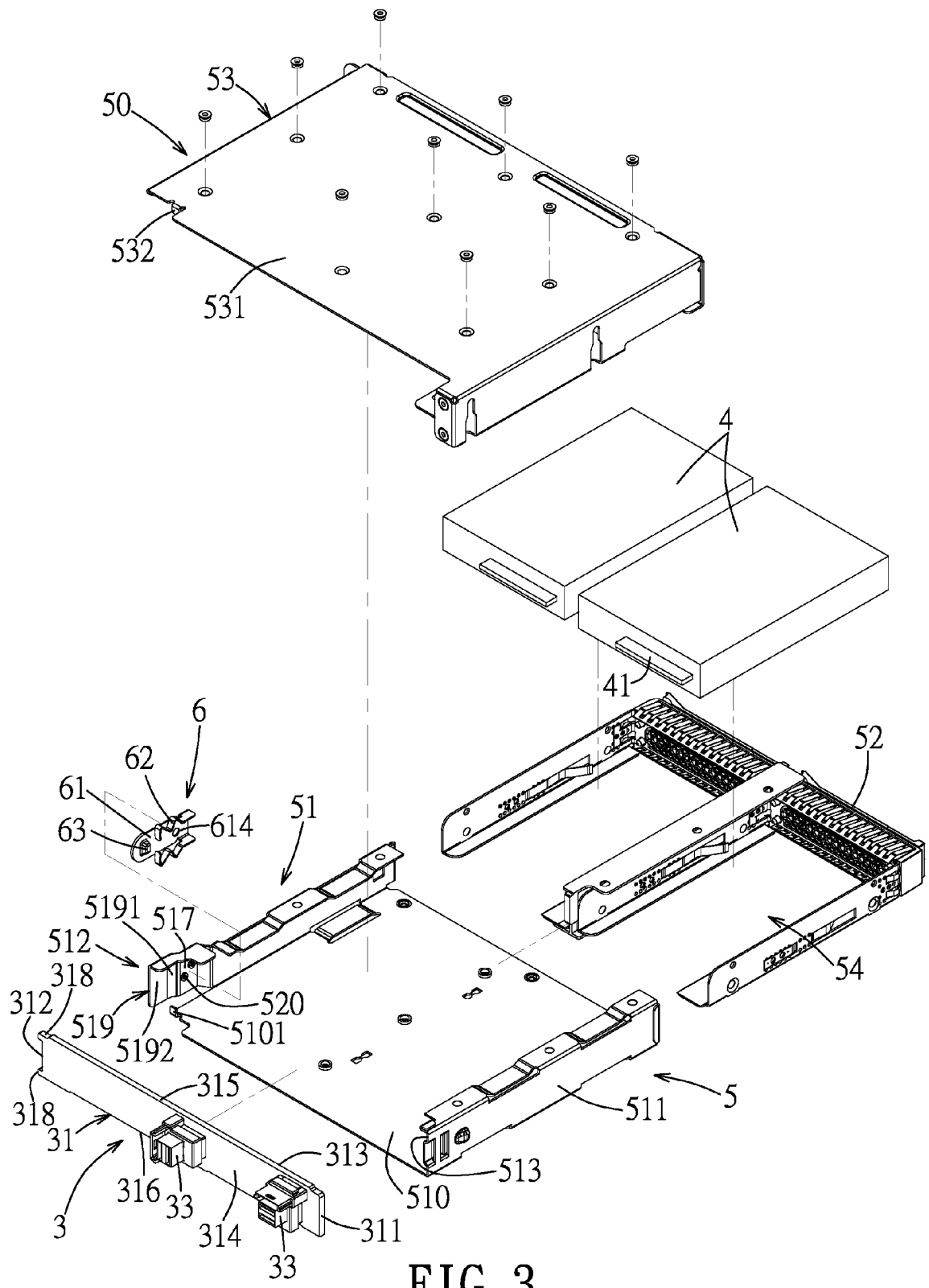
FIG. 3 is an exploded perspective view of the casing and the circuit module.
Figure 5:
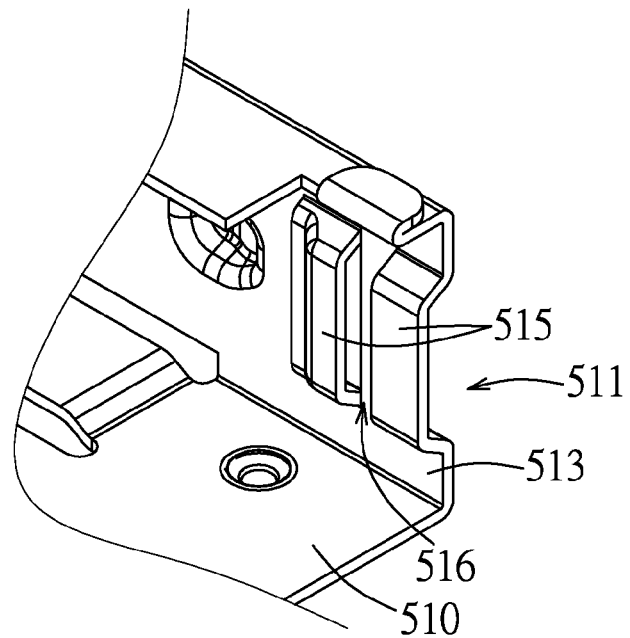
FIG. 5 is an enlarged fragmentary perspective view of a lower casing member of the casing, illustrating two positioning plate portions bent inwardly to protrude from an inner surface of a first side plate of the lower casing member.
Figure 7:
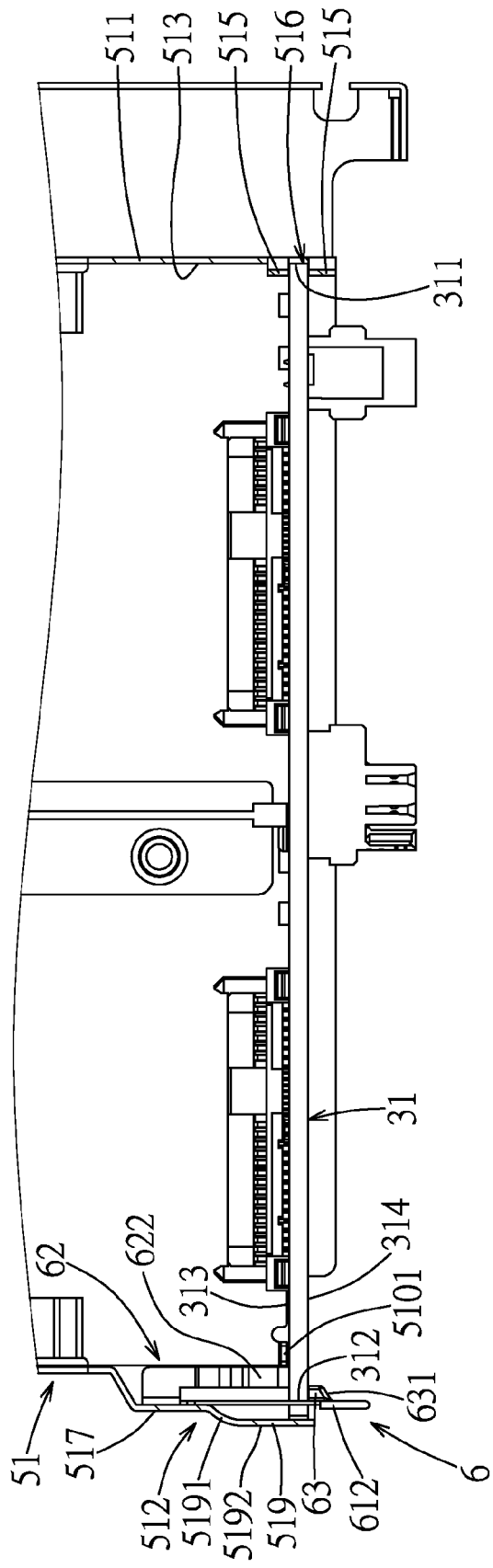
FIG. 7 is an enlarged fragmentary sectional view of the embodiment taken along line VII-VII of FIG. 2.
Figure 8:
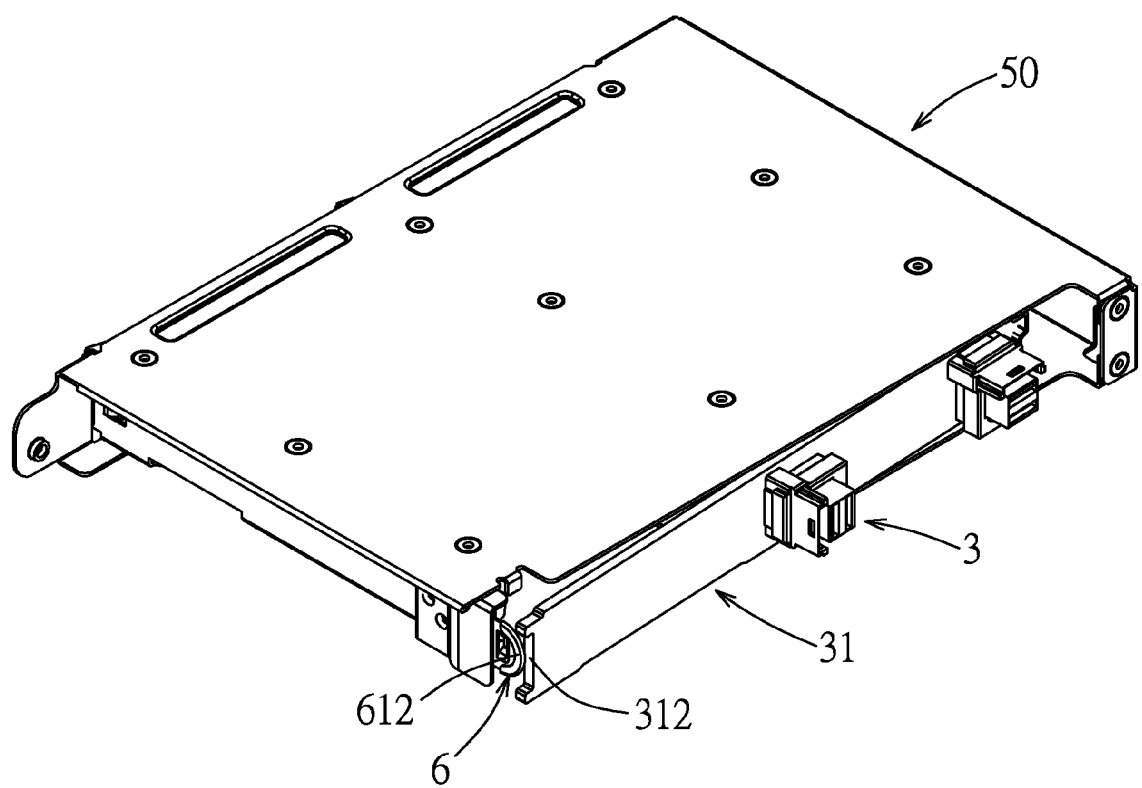
FIG. 8 is another assembled perspective view of the casing and the circuit module of the server of the embodiment, illustrating a second end of a plate member of the circuit module being moved to engage with an engaging piece of the clamping member.
Figure 9:
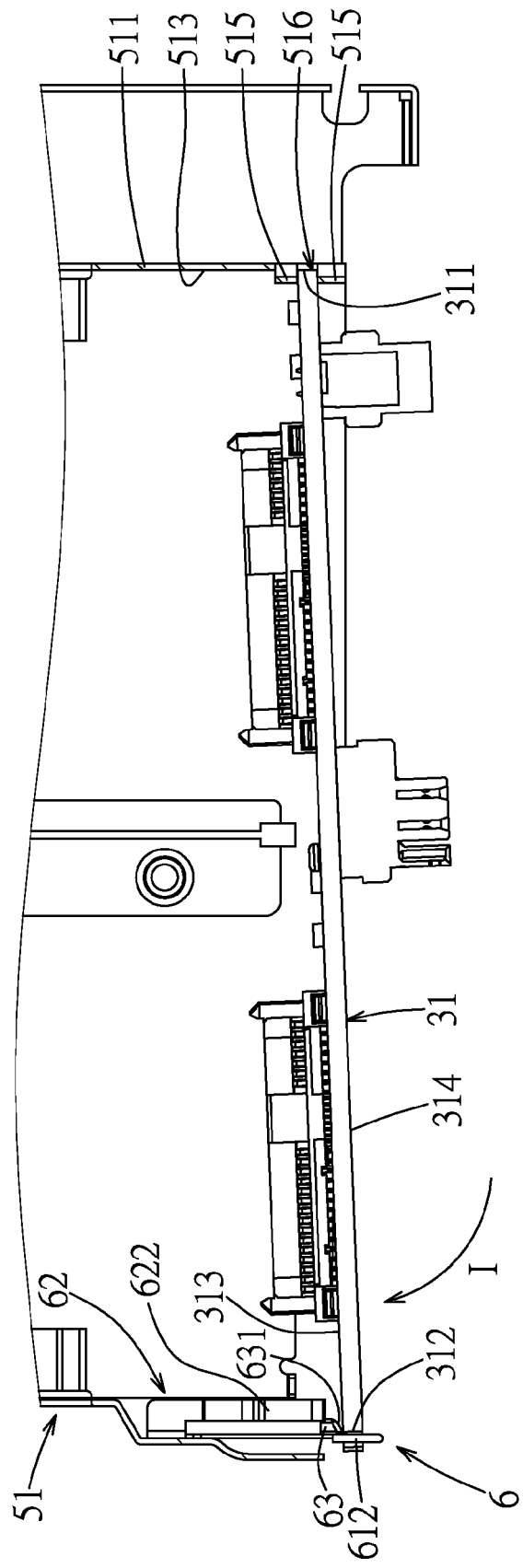
FIG. 9 is an enlarged fragmentary sectional view of the embodiment, illustrating how the second end of the plate member is moved toward the engaging piece in the direction of a first arrow.
Figure 10:
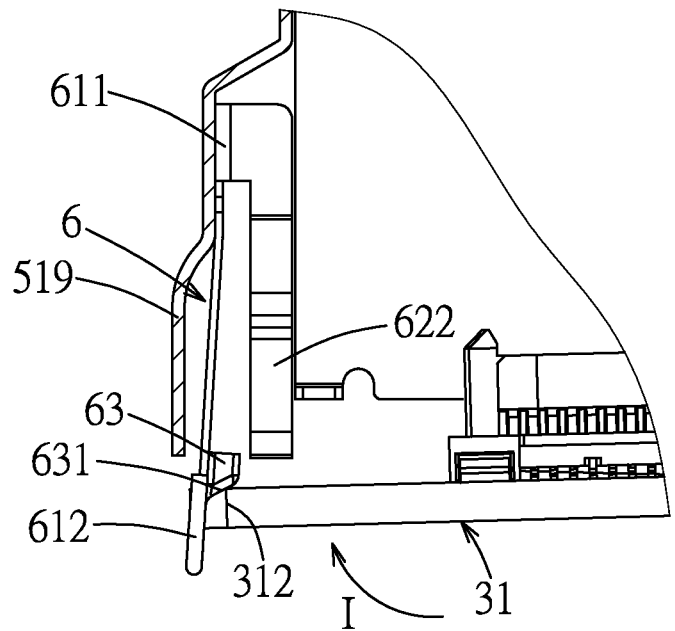
FIG. 10 is an enlarged fragmentary sectional view of FIG. 9.
Figure 11:
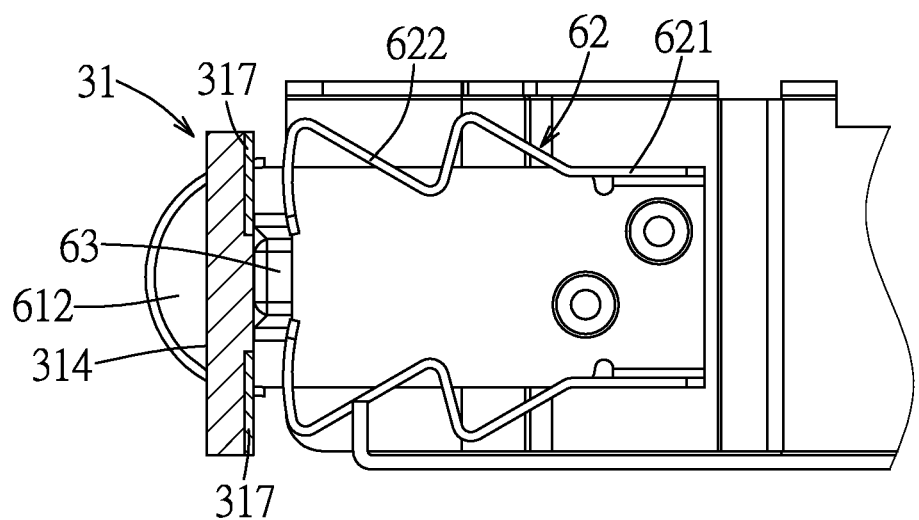
FIG. 11 is a schematic side view of FIG. 10.

As illustrated in FIGS. 3, 5 and 7, in this embodiment, the first side plate 511 includes two positioning plate portions 515 bent inwardly to protrude from the inner surface 513 and spaced apart in the front-rear direction (D3). The positioning plate portions 515 and the inner surface 513 cooperatively define an engaging groove 516 for engagingly receiving the first end 311 of the plate member 31. When the first end 311 of the plate member 31 is engagingly received in the engaging groove 516, the positioning plate portions 515 respectively abut against the first surface 313 and the second surface 314 of the plate member 31 so as to clamp therebetween the first end 311, thereby preventing movement of the first end 311 of the plate member 31 relative to the first side plate 511 in the front-rear direction (D3). Hence, the first end 311 of the plate member 31 can be stably positioned in the engaging groove 516 of the first side plate 511.

Figure 6:
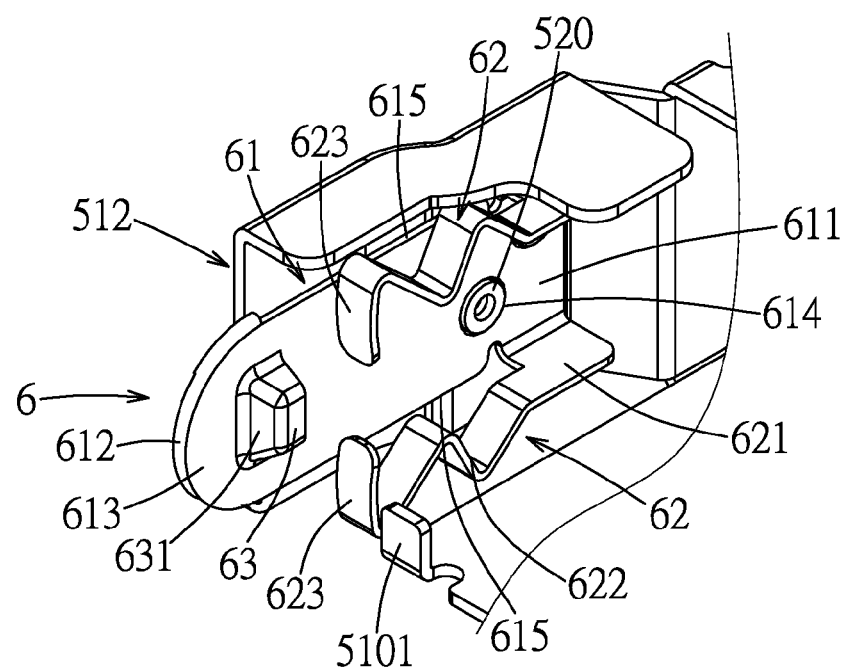
FIG. 6 is another enlarged fragmentary perspective view of the lower casing member, illustrating a clamping member being mounted on an inner side of a second side plate of the lower casing member.
Figure 14:
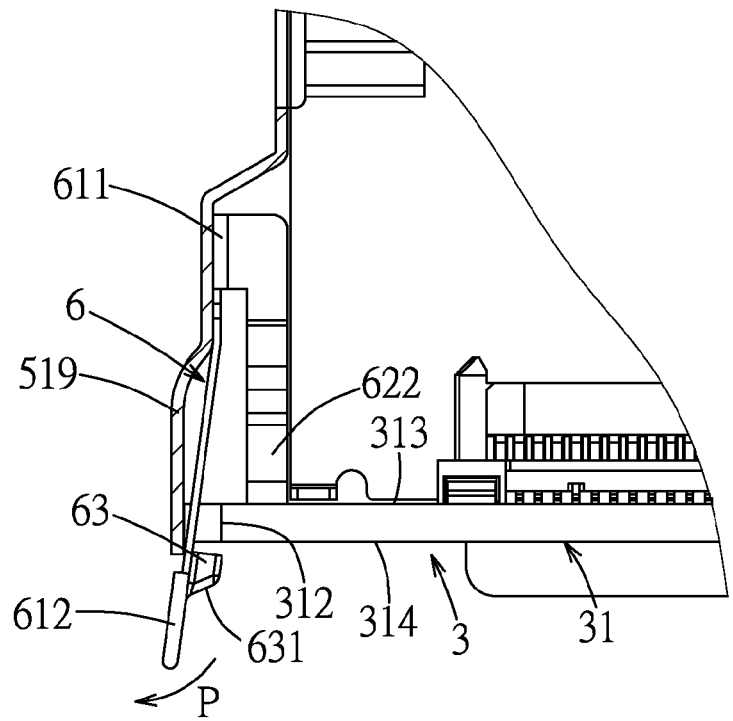
FIG. 14 is a view similar to FIG. 10, but illustrating the engaging piece in a releasing position.

With reference to FIGS. 3, 6 and 7, the clamping member 6 is made, for example, by stamping. The resilient plate 61 of the clamping member 6 includes a fixed portion 611 and a pull portion 612 which are integrally connected as one piece. The fixed portion 611 is connected to the inner side of the second side plate 512. The pull portion 612 partially protrudes outward from the casing body 50, and is spaced apart from the second side plate 512 at a distance. The fixed portion 611 and the pull portion 612 cooperatively define an inner surface 613 of the resilient plate 61. The inner surface 613 is opposite to the second side plate 512. The engaging piece 63 projects from the inner surface 613 at a position corresponding to the pull portion 612. The pull portion 612 is pullable to move the engaging piece 63 from an engaging position, as shown in FIG. 7, to a releasing position, as shown in FIG. 14. In the engaging position, the engaging piece 63 is engaged to the second surface 314 of the plate member 31 at the second end 312 thereof. In the releasing position, the engaging piece 63 is moved in a direction toward the second sideplate 512 and away from the second end 312 and the second surface 314 of the plate member 31. Through this, removal of the plate member 31 from the casing body 50 can be facilitated.

Specifically, the second side plate 512 includes a main plate portion 517, and a bent plate portion 519 bent outwardly from the main plate portion 517. The bent plate portion 519 has a bent section 5191 connected to the main plate portion 517, and a terminating section 5192 connected to the bent section 5191 opposite to the main plate portion 517. The fixed portion 611 of the resilient plate 61 is positioned on the main plate portion 517, for example, by riveting. In this embodiment, the main plate portion 517 is provided with two riveting columns 520 projecting from the inner side of the second side plate 512. The fixed portion 611 is formed with two rivet holes 614 (see FIG. 4). The riveting columns 520 are respectively engaged to the rivet holes 614. After the fixed portion 611 is positioned on the main plate portion 517, the pull portion 612 is spaced apart from the bent and terminating sections 5191, 5192 of the bent plate portion 519 at a distance. Through this, the pull portion 612 can be pulled relative to the fixed portion 611 toward the bent plate portion 519 so as to move the engaging piece 63 away from the second surface 314. It should be noted that the fixed portion 611 may be fixed to the main plate portion 517, for example, by soldering or by a hook-and-groove engaging method, and is not limited to the disclosure of this embodiment.

Moreover, to enhance convenient assembly of the plate member 31 to the casing body 50, the engaging piece 63 has a guide inclined surface 631 that is distal from the abutment arms 62 and that is gradually inclined rearward from the inner surface 613. The second end 312 of the plate member 31 is abuttable against the guide inclined surface 631 to urge the engaging piece 63 and the pull portion 612 to move toward the bent plate portion 519, so that the pull portion 612 is bent and deformed relative to the fixed portion 611 to store a restoring force. When the second end 312 of the plate member 31 passes over the engaging piece 63, the pull portion 612 is restored to its original position through the restoring force thereof, and the engaging piece 63 is disposed in the engaging position, as shown in FIG. 7. Thus, the plate member 31 is easily and quickly assembled to and positioned on the casing body 50.

On the other hand, to enhance convenient disassembly of the plate member 31 from the casing body 50, in this embodiment, each abutment arm 62 of the clamping member 6 is a biasing arm that biases the first surface 313 of the plate member 31 toward the engaging piece 63. When the engaging piece 63 is engaged to the second surface 314 of the plate member 31, each abutment arm 62 is squeezed and pressed by the first surface 313 so as to deform and store a restoring force. When the pull portion 612 is pulled to move the engaging piece 63 from the engaging position (see FIG. 7) to the releasing position (see FIG. 14), through the restoring force of each abutment arm 62, the plate member 31 is pushed by the abutment arms 62 to pop out a distance, so that a worker can easily grab the plate member 31 and remove the same from the casing body 50.

Concretely speaking, the resilient plate 61 of the clamping member 6 is elongated, and has two opposite long sides 615 that extend from the fixed portion 611 to the pull portion 612. Each abutment arm 62 includes a connecting section 621 connected to the fixed portion 611, and a bent section 622 connected to the connecting section 621 and having a wave shape that extends in the front-rear direction (D3). Specifically, the connecting sections 621 of the abutment arms 62 are respectively connected to the long sides 615 of the resilient plate 61 at a location corresponding to the fixed portion 611. The bent section 622 includes an abutment face 623 that is curved. Because of the way the connecting section 621 of each abutment arm 62 is connected to the corresponding long side 615, the structural design of the fixed portion 611 is not affected, so that the fixed portion 611 can be formed with an engaging structure, for example, the rivet holes 614, for engagement with the riveting columns 520 of the main plate portion 517.

Figure 4:
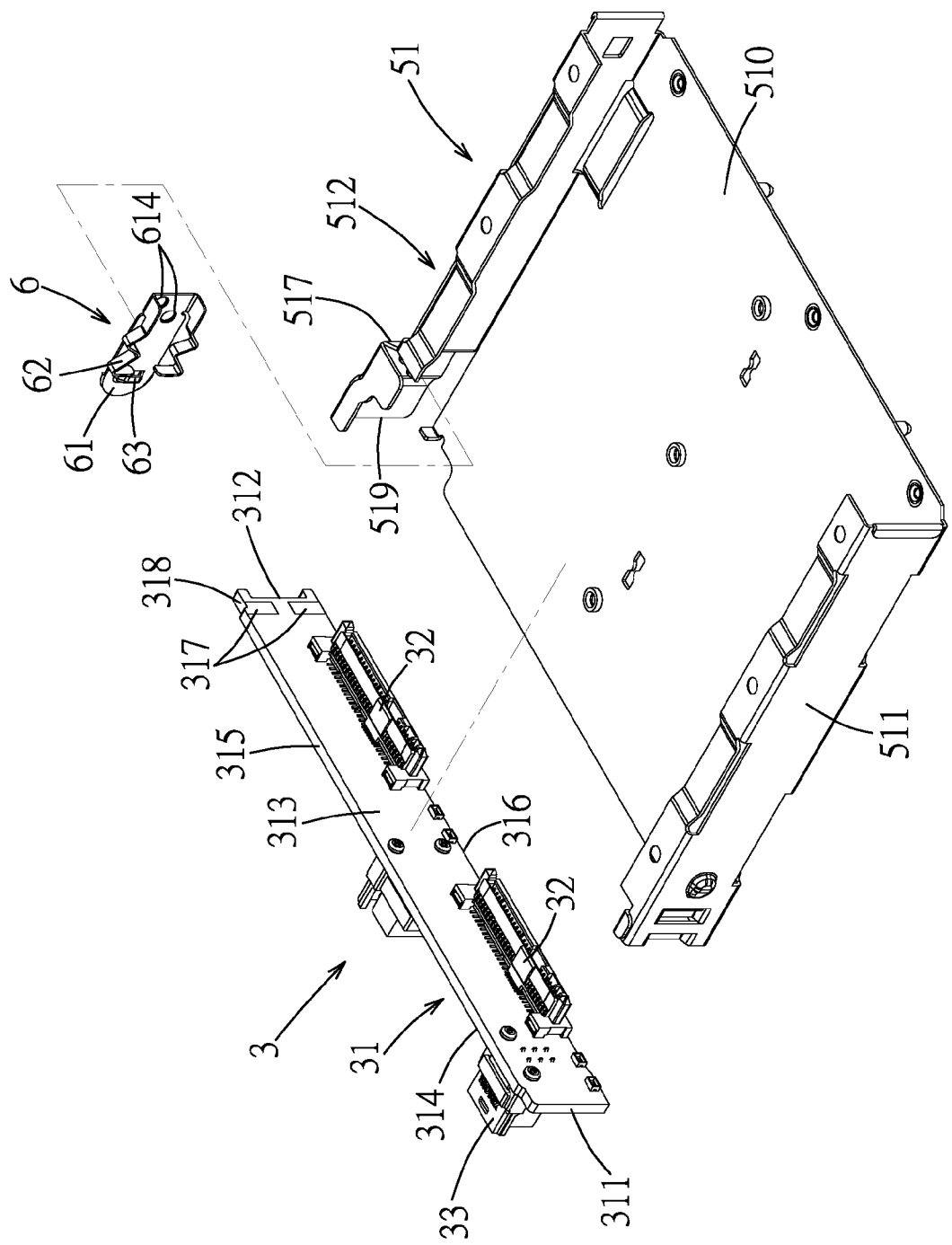
FIG. 4 is an exploded perspective view of the circuit module and a portion of the casing.

With reference to FIGS. 4, 6 and 7, the plate member 31 further includes two metal pads 317 provided on the first surface 313 and spaced apart in the top-bottom direction (D1). In this embodiment, each of the metal pads 317 is a copper foil. The abutment face 623 of the bent section 622 of each abutment arm 62 is used to abut against a respective metal pad 317. Because the abutment face 623 is curved, the abutment face 623 can maintain a good contact with the respective metal pad 317. Since each of the clamping member 6, the casing body 50 and the chassis 1 (see FIG. 1) is made of metal, the metal pads 317, the clamping member 6, the casing body 50 and the chassis 1 can cooperatively forma ground path. When static electricity is produced by the plate member 31 during operation, the static electricity is effectively channeled to the ground through the ground path, and will not affect the transmission signal operations of the first and second electrical connectors 32, 33. Moreover, through abutment of the abutment faces 623 of the bent sections 622 with the two metal pads 317, one of the top and bottom ends 315, 316 of the plate member 31 is prevented from deflection.

It should be noted that the plate member 31 may be provided with one metal pad 317 and the clamping member 6 may be provided with one bent section 622. The effect of channeling the static electricity to the ground can be similarly achieved.

Referring to FIGS. 8 to 11, to assemble the plate member 31 of the circuit module 3 to the casing body 50, firstly, the plate member 31 is inclined at a suitable angle so as to align the first end 311 thereof with the engaging groove 516 of the first side plate 511, after which the first end 311 of the plate member 31 is inserted into the engaging groove 516. Next, with the first end 311 acting as a fulcrum, the second end 312 of the plate member 31 is rotated in the direction of a first arrow (I) (see FIG. 9) until the second end 312 abuts against the guide inclined surface 631 of the engaging piece 63. A component of force applied to the guide inclined surface 631 by the second end 312 of the plate member 31 urges the engaging piece 63 and the pull portion 631 to move toward the bent plate portion 519. At this time, the pull portion 631 is bent and deformed relative to the fixed portion 611 and stores a restoring energy.

Figure 12:
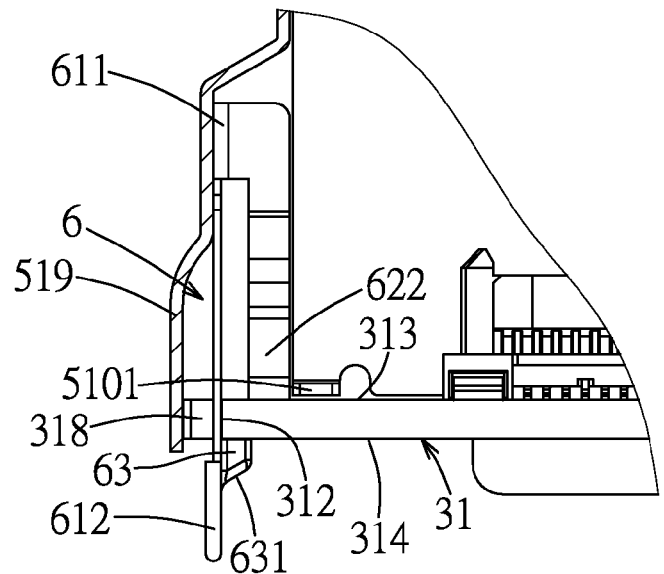
FIG. 12 is a view similar to FIG. 10, but illustrating the engaging piece in an engaging position.
Figure 13:
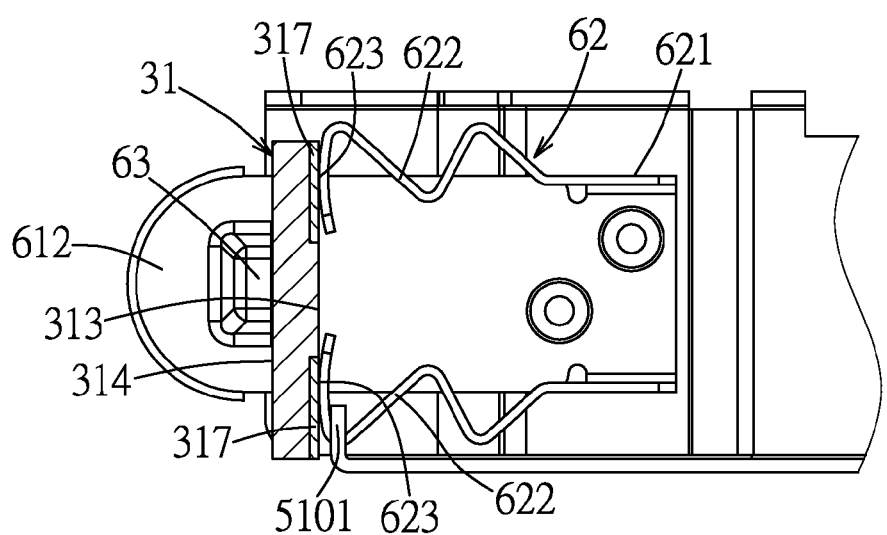
FIG. 13 is a schematic side view of FIG. 12.

Referring to FIGS. 12 and 13, in combination with FIGS. 3 and 7, when the plate member 31 is rotated until each metal pad 317 abuts against the respective abutment face 623 of the bent section 622, the plate member 31 gradually compresses the bent sections 622 of the abutment arms 62, so that the bent sections 622 deform and store restoring forces. As the plate member 31 passes over the engaging piece 63, through the restoring force of the pull portion 612, the engaging piece 63 is restored to the engaging position, where the engaging piece 63 is engaged to the second surface 314. At this time, the top plate 531 and the bottom plate 510 respectively abut against the top and bottom ends 315, 316 of the plate member 31, and the first side plate 511 and the pull portion 612 of the resilient plate 61 respectively clamp therebetween the first end 311 and the second end 312 of the plate member 31. Further, each abutment arm 62 of the clamping member 6 abuts against a respective metal pad 317, and the engaging piece 63 is engaged to the second surface 314 of the plate member 31. Thus, the plate member 31 can be stably positioned on the casing body 50.

With reference to FIGS. 2, 3, 7 and 12, because the second end 312 of the plate member 31 abuts against the pull portion 612 which can be bent and deformed, to ensure that the plate member 31 will not be affected by an external force to move in the left-right direction (D2), the plate member 31 further includes two protrusions 318 protruding from the second end 312 and spaced apart in the top-bottom direction (D1). The protrusions 318 are used to abut against the bent plate portion 519. Through abutment of the first end 311 of the plate member 31 against the inner surface 513 of the first side plate 511 and through the abutment of each protrusion 318 with the bent plate portion 519 of the second side plate 512, the plate member 31 is ensured not to be affected by the external force to move in the left-right direction (D2).

Figure 2:
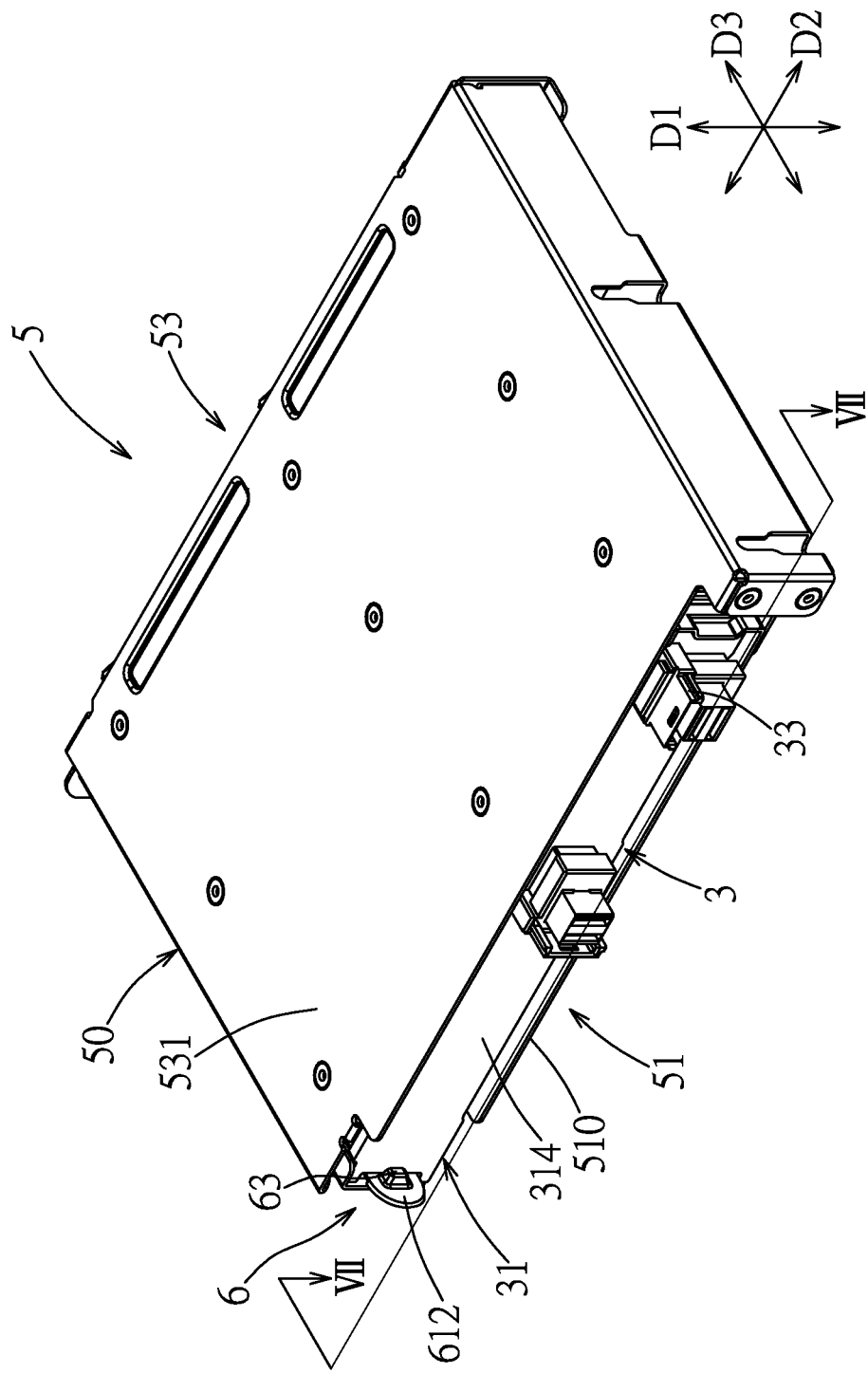
FIG. 2 is an assembled perspective view of a casing and a circuit module of the server of the embodiment.

With reference to FIGS. 2, 3 and 13, in addition, because each metal pad 317 on the first surface 313 of the plate member 31 is in abutment with the bent section 622 which can be bent and deformed, to ensure that the plate member 31 will not be affected by an external force to move in the front-rear direction (D3), in this embodiment, the lower casing member 51 further includes a lower stop piece 5101 projecting upward from a front end of the bottom plate 510, and the upper casing member 53 further includes an upper stop piece 532 projecting downward from a front end of the top plate 531. The lower stop piece 5101 and the upper stop piece 532 abut against the first surface 313 of the plate member 31 to stop rearward movement of the plate member 31. Through this, the plate member 31 is ensured not to be affected by the external force to move in the front-rear direction (D3). It should be noted that one of the top and bottom plates 531, 510 may be provided with one stop piece. The effect of stopping rearward movement of the first surface 313 of the plate member 31 can be similarly achieved.

Figure 15:
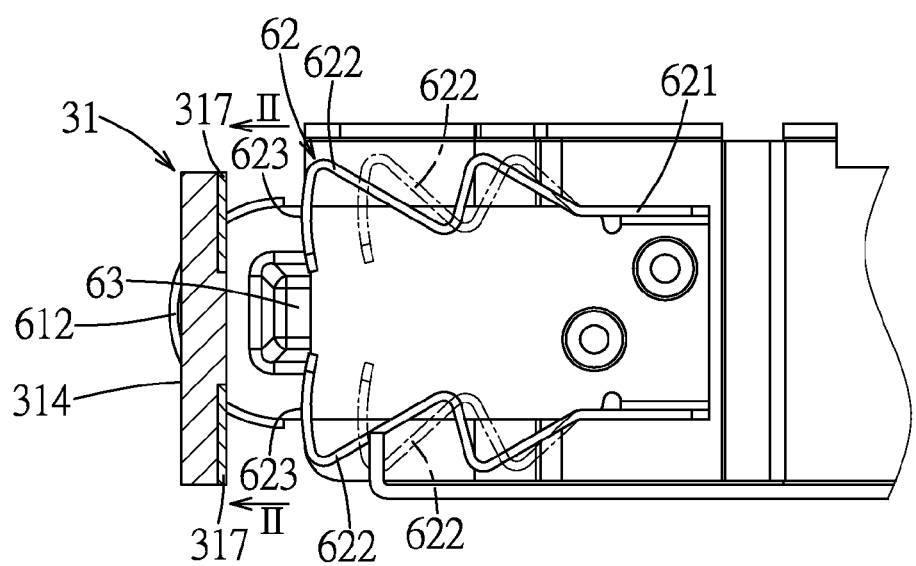
FIG. 15 is a fragmentary schematic side view of the embodiment, illustrating how bent sections of abutment arms of the clamping member push the plate member outwardly in the direction of a second arrow.
Figure 16:
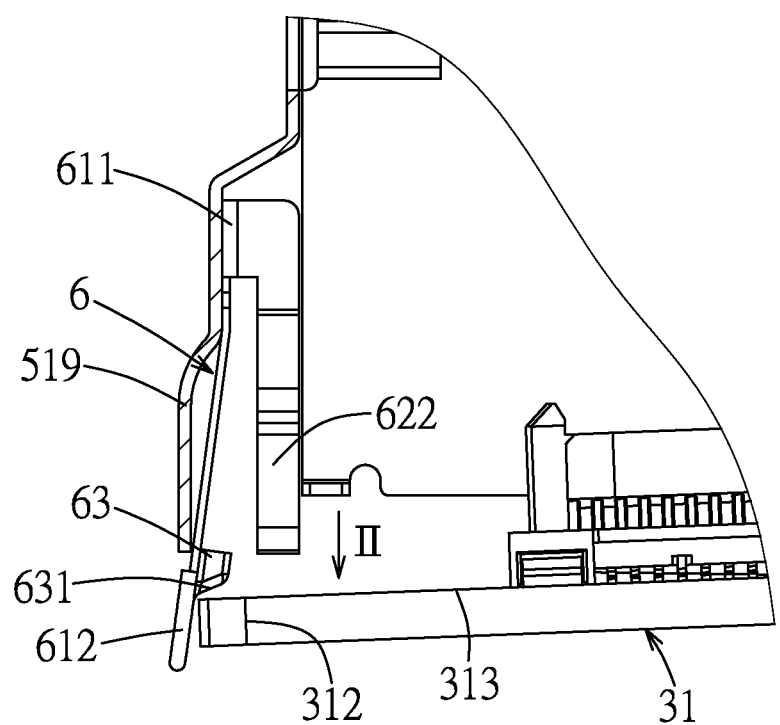
FIG. 16 is a view similar to FIG. 10, but illustrating how the bent sections of the abutment arms of the clamping member push the plate member outwardly in the direction of the second arrow.

Referring to FIGS. 14 to 16, to disassemble the plate member 31 of the circuit module 3 from the casing body 50 (see FIG. 8), the pull portion 612 is pulled in the direction of the arrow (P) so as to move the engaging piece 63 away from the second surface 314 of the plate member 31, thereby disposing the engaging piece 63 in the releasing position. At this time, through the restoring force of the bent sections 622 of the abutment arms 62, the second end 312 of the plate member 31 is pushed by the bent sections 622 to move in the direction of a second arrow (II), so that the second end 312 of the plate member 31 passes over the engaging piece 63. A worker can then grab the second end 312 of the plate member 31 to remove the plate member 31 from the casing body 50.

In summary, through the configurations of the casing body 50 and the clamping member 6, the plate member 31 can be easily and quickly assembled to and disassembled from the casing body 50 without using an auxiliary tool. Through this, convenience of assembly and disassembly of the plate member 31 can be enhanced, and the working time can be reduced. Moreover, through the abutment of the abutment face 623 of each abutment arm 62 of the clamping member 6 with the respective metal pad 317, the casing 5 and the chassis 1 can channel the static electricity of the plate member 31 to the ground. Therefore, the objects of the present invention can be achieved.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A casing for fixing a plate member, the plate member including opposite first and second ends and opposite first and second surfaces between the first and second ends, said casing comprising:
    a casing body including a first side plate and a second side plate opposite to said first side plate; and
    a clamping member including a resilient plate disposed on an inner side of said second side plate, at least one abutment arm protruding inwardly from said resilient plate, and an engaging piece projecting from said resilient plate in proximity to said abutment arm;
    wherein said first side plate and said resilient plate are respectively adapted to abut against the first and second ends of the plate member for clamping therebetween the plate member, said abutment arm being adapted to abut against the first surface of the plate member, said engaging piece being adapted to releasably engage the second surface of the plate member, said resilient plate being pullable to move said engaging piece away from the second surface of the plate member.

2. The casing as claimed in claim 1, wherein said abutment arm is a biasing arm for biasing the first surface of the plate member toward said engaging piece.

3. The casing as claimed in claim 1, the plate member includes a metal pad disposed on the first surface thereof, wherein said clamping member and said casing body are made of metal, said abutment arm including an abutment face for abutment with the metal pad.

4. The casing as claimed in claim 2, wherein said resilient plate includes a fixed portion, and a pull portion which is integrally connected as one piece with said fixed portion and which is spaced apart from said second side plate, said engaging piece projecting from one side of said pull portion that is opposite to said second side plate, said pull portion being pullable to move said engaging piece away from the second surface of the plate member.

5. The casing as claimed in claim 4, wherein said engaging piece has a guide inclined surface that is distal from said abutment arm and that is adapted to abut against the second end of the plate member, said pull portion and said engaging piece being adapted to be urged by the plate member to move toward said second side plate when the second end of the plate member abuts against said guide inclined surface.

6. The casing as claimed in claim 4, the plate member includes at least one metal pad disposed on the first surface thereof, wherein said abutment arm includes a connecting section connected to said fixed portion, and a bent section connected to said connecting section and having a wave shape, said bent section of said abutment arm including an abutment face that is curved for abutment with the metal pad, said clamping member and said casing body being made of metal.

7. The casing as claimed in claim 6, the plate member includes two said metal pads disposed on the first surface thereof, wherein said resilient plate is elongated and has two opposite long sides extending from said fixed portion to said pull portion, said clamping member including two said abutment arms, said connecting sections of said abutment arms being respectively connected to said long sides, said abutment faces of said bent sections of said abutment arms being adapted to abut respectively against the metal pads.

8. The casing as claimed in claim 7, the plate member further includes two protrusions projecting from the second end thereof, wherein said second side plate includes a main plate portion, and a bent plate portion bent outwardly from said main plate portion, said fixed portion of said resilient plate being positioned on said main plate portion, said pull portion of said resilient plate being spaced apart from said bent plate portion and being movable relative to said fixed portion toward said bent plate portion, said bent plate portion being adapted to abut against the protrusions of the plate member.

9. The casing as claimed in claim 1, wherein said first side plate has an inner surface, and two spaced-apart positioning plate portions bent inwardly to protrude from said inner surface, said positioning plate portions being adapted to respectively abut against the first surface and the second surface of the plate member so as to clamp therebetween the first end of the plate member, said positioning plate portions and said inner surface of said first side plate cooperatively defining an engaging groove for engagingly receiving the first end of the plate member.

10. The casing as claimed in claim 9, the plate member further includes a top end and a bottom end, wherein said casing body further includes a top plate and a bottom plate for respectively abutting against the top and bottom ends of the plate member so as to clamp therebetween the plate member, one of said top and bottom plates being provided with a stop piece for abutment with the first surface of the plate member.

11. A server, comprising:
    a circuit module including a plate member and an electrical connector, said plate member being a circuit board and including opposite first and second ends, and opposite first and second surfaces between said first and second ends, said electrical connector being disposed on said first surface;
    a casing including
        a casing body including a first side plate and a second side plate opposite to said first side plate, and
        a clamping member including a resilient plate disposed on an inner side of said second side plate, at least one abutment arm protruding inwardly from said resilient plate, and an engaging piece projecting from said resilient plate in proximity to said abutment arm;
        wherein said first side plate and said resilient plate respectively abut against said first and second ends of said plate member for clamping therebetween said plate member, said abutment arm abutting against said first surface of said plate member, said engaging piece being releasably engaged to said second surface of said plate member, said resilient plate being pullable to move said engaging piece away from said second surface of said plate member; and
    a hard disk module disposed in said casing body and including a mating connector electrically connected to said electrical connector of said circuit module.

12. The server as claimed in claim 11, wherein said abutment arm is a biasing arm for biasing said first surface of said plate member toward said engaging piece.

13. The server as claimed in claim 11, wherein said plate member includes a metal pad disposed on said first surface thereof, said clamping member and said casing being made of metal, said abutment arm including an abutment face for abutment with said metal pad.

14. The server as claimed in claim 12, wherein said resilient plate includes a fixed portion, and a pull portion which is integrally connected as one piece with said fixed portion and which is spaced apart from said second side plate, said engaging piece projecting from one side of said pull portion that is opposite to said second side plate, said pull portion being pullable to move said engaging piece toward said second side plate so as to move said engaging piece away from said second surface of said plate member.

15. The server as claimed in claim 14, wherein said engaging piece has a guide inclined surface that is distal from said abutment arm and that is abuttable against said second end of said plate member, said pull portion and said engaging piece being urged by said plate member to move toward said second side plate when said second end of said plate member abuts against said guide inclined surface.

16. The server as claimed in claim 14, wherein said plate member includes at least one metal pad disposed on said first surface thereof, said abutment arm including a connecting section connected to said fixed portion, and a bent section connected to said connecting section and having a wave shape, said bent section including an abutment face that is curved for abutment with said metal pad, said clamping member and said casing body being made of metal.

17. The server as claimed in claim 16, wherein said plate member includes two said metal pads disposed on said first surface, said resilient plate being elongated and having two opposite long sides extending from said fixed portion to said pull portion, said clamping member including two said abutment arms, said connecting sections of said abutment arms being respectively connected to said long sides, said abutment faces of said bent sections of said abutment arms being respectively abuttable against said metal pads.

18. The server as claimed in claim 17, wherein said plate member further includes two protrusions projecting from said second end, said second side plate including a main plate portion, and a bent plate portion bent outwardly from said main plate portion, said fixed portion of said resilient plate being positioned on said main plate portion, said pull portion of said resilient plate being spaced apart from said bent plate portion and being movable relative to said fixed portion toward said bent plate portion, said bent plate portion abutting against said protrusions of said plate member.

19. The server as claimed in claim 11, wherein said first side plate has an inner surface, and two spaced-apart positioning plate portions bent inwardly to protrude from said inner surface of said first side plate, said positioning plate portions respectively abutting against said first surface and said second surface of said plate member so as to clamp therebetween said first end of said plate member, said positioning plate portions and said inner surface of said first side plate cooperatively defining an engaging groove for engagingly receiving said first end of said plate member.

20. The server as claimed in claim 19, wherein said plate member further includes a top end and a bottom end, said casing body further including a top plate and a bottom plate for respectively abutting against said top and bottom ends of said plate member so as to clamp therebetween said plate member, one of said top and bottom plates being provided with a stop piece for abutment with said first surface of said plate member.

* * * * *